United States Patent [19]

Grimshaw et al.

[11] 3,947,562
[45] Mar. 30, 1976

[54] PRODUCTION OF A FORM OF ALUMINA WHISKERS

[75] Inventors: Rex William Grimshaw, Rawdon near Leeds, England; John Gilleran Peacey, Pointe Claire, Canada

[73] Assignee: Hepworth & Grandage Limited, England

[22] Filed: Apr. 4, 1975

[21] Appl. No.: 565,263

[52] U.S. Cl. ............... 423/630; 423/625; 423/495; 423/496
[51] Int. Cl.² .......................................... C01F 7/02
[58] Field of Search................... 423/625, 630, 496

[56] References Cited
UNITED STATES PATENTS

| | | | |
|---|---|---|---|
| 3,023,115 | 2/1962 | Waines et al. | 106/65 |
| 3,077,380 | 2/1963 | Waines et al. | 423/625 |
| 3,094,385 | 6/1963 | Brisbin et al. | 423/630 |
| 3,240,560 | 3/1966 | Spear | 423/625 |
| 3,365,316 | 1/1968 | Kingery et al. | 156/614 |
| 3,582,271 | 6/1971 | Minagawa et al. | 423/625 |
| 3,721,731 | 3/1973 | Belknap | 423/624 |
| 3,760,066 | 9/1973 | Calcagno et al. | 423/496 |

*Primary Examiner*—Herbert T. Carter
*Attorney, Agent, or Firm*—Brisebois & Kruger

[57] ABSTRACT

The invention relates to the production of alumina whiskers from alumina-bearing material by preparing an intimate mixture of such material and carbon and then passing a stream of gaseous aluminium trihalide and an inert carrier gas thereover in a first zone at an elevated temperature, usually 1400°C to 1800°C, at which reaction occurs to form aluminium monohalide and carbon monoxide. The gaseous stream comprising the two latter materials is then passed to a second zone maintained at a less elevated temperature than the first zone, usually 1400°–1000°C, at which temperature the reaction is reversed to produce a gaseous stream carrying alumina and carbon. Under conditions of low supersaturation the alumina deposits as single crystal alumina whiskers from which any carbon can be removed by an oxygen-containing gas at temperatures of 800°–1000°C.

15 Claims, No Drawings

PRODUCTION OF A FORM OF ALUMINA WHISKERS

This invention relates to the production of a fibrous form of alumina known as alumina whiskers. Such whiskers consist of single crystals of alumina having a cross-section of less than $5 \times 10^{-2}$ sq. mm. and an aspect ratio of more than 10:1 and they are of interest as a reinforcing material for metals.

Alumina whiskers have been produced by other technniques, e.g. by the controlled oxidation of molten aluminium in which a mixture of oxygen and a gas which does not react with aluminium is passed over the surface of molten aluminium. Alumina whiskers are formed upon the surface of the molten aluminium but are usually contaminated by small globules of aluminium.

Another proposal for the formation of alumina whiskers has been the oxidation of gaseous aluminium trichloride with carbon dioxide in the presence of sufficient hydrogen to combine with the chlorine present in the aluminium trichloride and form hydrogen chloride. The reaction has been carried out at temperatures of 1275° – 1700°C. The physical form of the product depends upon the degree of supersaturation of the reacting system with the alumina produced but it is not easy to control nor is it easy to produce whiskers of alumina to the substantial exclusion of other forms.

It is an object of the invention to produce alumina whiskers which can be readily freed from impurities unavoidably present therein.

The present invention provides a process for the production of alumina whiskers which comprises contacting an intimate mixture of particulate alumina-bearing material and a particulate form of carbon with a stream of gaseous aluminium trihalide in a first reaction zone maintained at an elevated temperature at which reaction occurs to form aluminium monohalide and carbon monoxide, transporting the gaseous products comprising said monohalide and carbon monoxide to a second reaction zone maintained at a lower temperature than said first reaction temperature, this said lower temperature being one at which reversal of the reaction which has occurred in said first reaction zone occurs with formation of a gaseous stream supersaturated with respect to alumina and under the conditions prevailing in the second reaction zone and deposition of the desired whisker form of alumina.

The invention depends primarily upon the occurrence of the reaction $$Al_2O_3 + 3C + AlX_3 \rightleftharpoons 3AlX + 3CO \qquad (I)$$

where X is a halogen element. The occurrence of such a reaction has been postulated on thermochemical grounds but hitherto experimental evidence therefor has been minimal. It has now been found that not only does this reaction occur at elevated temperatures of the order of 1400°–1800°C but further that on reducing the temperature by approximately 200° – 400°C so that it is below 1400°C the reverse reaction is caused to occur with deposition of alumina whiskers and precipitation of carbon. The halogen X desirably has an atomic number not greater than 53 and is preferably chlorine or bromine.

Since it is desirable that the alumina whiskers produced be as free as possible from impurities, it is preferred to form gaseous anhydrous aluminium trihalide from its elements in a preliminary reaction zone by passing a mixture of the vapour of the corresponding halogen gas and an inert carrier gas, which may be any of the inert gases present in the atmosphere, such as helium or argon or any suitable mixture thereof, over a bath of high purity molten aluminium. A recommended reaction temperature is about 700°C which experiments have shown to be below the temperature at which any of the aluminium monohalides exist. The resulting mixture from this reaction is then passed over a heated unmolten form of aluminium which has a large surface area relative to the volume thereof, for example in the form of one or more coils, to ensure that no unreacted halogen is present in the gaseous mixture being passed to the first reaction zone.

In the first reaction zone the vapour of the aluminium trihalide admixed with inert gas is led over one or more layers of an intimate mixture of finely divided alumina-bearing material and carbon preferably present in the stoichiometric proportions required by equation (I) above. The temperature in the first reaction zone is conveniently maintained between 1400° and 1800°C, preferably 1500° to 1700°C, the higher temperatures being used with the more rapid rates of flow of reactants through the said first reaction zone. The rate of flow of the inert gas through the reaction zones and the concentration of aluminium trihalide therein should be such as to ensure that, after reaction with the alumina and carbon with concomitant formation of aluminium monohalide and subsequent cooling in the second reaction zone with reversal of the reaction which occurred in the first reaction zone, the inert gas becomes slightly supersaturated with alumina under the prevailing conditions so as to provide conditions favourable to the deposition of alumina in the form of whiskers. If the inert gas becomes too supersaturated a mixture of whiskers and platelets of alumina is liable to be deposited and the greater the degree of supersaturation the greater the proportion of platelets deposited. The platelets may be so small that they resemble powder at very substantial degrees of supersaturation and this should be avoided.

The optical properties of the whiskers of alumina produced reveal that they constitute single crystals and, as when growing other single crystals, the best results are obtained when they are grown in a slightly supersaturated medium. A plurality of variables are involved and as with any given design of apparatus some preliminary experiments will be necessary to indicate what the optimum conditions are in a particular case.

Thus, in carrying out preliminary experiments the production of a mixture of both whiskers and platelets of alumina predominating in platelets or in powdered alumina in the cooler second reaction zone will indicate that under the conditions of the experiment a too great degree of supersaturation of the gaseous stream entering the cooler zone has occurred and the conditions must be modified to prevent this occurring, e.g. either by reducing the proportion of halogen in the gaseous stream which is in contact with the molten aluminium, or by less rapid cooling of the effluent from the first zone in which the aluminium trihalide vapour is in contact with the intimate mixture of alumina and carbon, or by reducing the absolute pressure of the gaseous stream or by any combination of these expedients.

In view of the temperatures involved, the recommended form of carbon to be used is graphite.

In the second cooler reaction zone the reaction is reversed, i.e. it proceeds from right to left resulting in the formation of alumina and carbon. The alumina is preferably allowed to deposit by condensation on the surface of a substrate, e.g. a boat, formed from α-alumina which is located in the second zone. Carbon separates and precipitates in a zone proximate to the second reaction zone in which the alumina whiskers are deposited and usually the two zones overlap. It is then necessary to remove the carbon from the whiskers of alumina, by discontinuing the supply of the gaseous stream containing the aluminium trihalide and replacing it by a stream of oxygen-containing gas the other components of which are inert with respect to alumina at elevated temperatures, e.g. nitrogen and/or any of the inert gases. The temperature should be maintained at a suitable level to bring about oxidation of the carbon present to carbon monoxide and/or dioxide. For this purpose temperatures of 800°C and above, e.g. 800° to 1000°C are suitable. In this way contaminating carbon is converted into gaseous carbon monoxide and/or carbon dioxide and this is swept away in the stream of oxygen-containing gas.

The second cooler reaction zone may be a zone of diminishing temperature in the direction of flow of the reaction mixture. Thus, the temperature may decrease from 1400°C at the end nearest to the first reaction zone to 1000°C at the end remote from the first reaction zone.

When the reaction (I) proceeds from left to right an increase in volume accompanies the formation of the reaction products and, correspondingly, there is a decrease in volume when the reaction proceeds from right to left. However, since it is important to enable the reaction to proceed from left to right in the first reaction zone, it is advantageous that a subatmospheric pressure be maintained in the first reaction zone. Since it is most convenient to operate with continuous flow from the first reaction zone to the second reaction zone and with these zones being maintained under substantially the same pressure, it is preferable to maintain both said zones at a subatmospheric pressure. It is preferred to maintain the zones at a pressure less than 0.5 atmosphere absolute pressure. Pressures of 0.05 to 0.50 atm. are preferred.

The behaviour of the α-alumina whiskers thus obtained in a beam of polarised light indicates that the whiskers are of c-type which have grown on the 0001 axis (Miller indices) as single crystals. This type has a regular hexagonal cross-section. Specimens examined under an electron microscope had an extremely high aspect ratio viz. 100–10,000 to 1.

The following example illustrates the invention.

EXAMPLE

A charge was prepared comprising an intimate mixture of 3 parts by weight of alumina and 1 part by weight of graphite.

A part of the charge was used to fill a recrystallised α-alumina boat which was placed in a tubular electric furnace. One end of the furnace was connected to apparatus designed to produce anhydrous aluminium trichloride by passing chlorine gas over molten aluminium whilst the other end of the furnace was connected to a condenser and thence to a discharge line. The apparatus for producing anhydrous aluminium trichloride was connected to a source of inert gas, in this case, argon. A vacuum pump was also connected to the apparatus so that the whole apparatus could be operated under reduced pressure.

The assembled apparatus was first swept out with argon in order to remove oxygen and moisture. The aluminium metal was then heated until it became molten whilst continuing to pass argon and, when the aluminium was wholly molten, chlorine was admixed with the argon in a preliminary stage and the mixture led over the molten aluminium. Reaction occurred at the surface of the aluminium and the anhydrous aluminium trichloride thus produced volatilised as it was formed and became entrained in the stream of argon. The resulting stream of aluminium trichloride was passed through a preheater operating at 1000°C and then led into the tubular electric furnace which was operated at 1600°C where the stream diffused into the intimate mixture of alumina and graphite and reacted therewith giving rise to aluminium monochloride and carbon dioxide. Beyond the alumina boat the temperature of the furnace gradually decreased and it was in the part of the tube located in this zone of decreased temperature that a woolly mass of alumina whiskers was produced and, in proximity thereto, a deposit of carbon which contaminated one end of the woolly mass. The pressure was 0.25 atmosphere absolute pressure.

The effluent gases from the tube were cooled and passed through a condenser operated at substantially 200°C whence liquid aluminium trichloride collected in a sump and solildified. The residual gases were washed with alkali and then allowed to pass into the atmosphere.

The contents of the boat were purified from carbon in a separate operation by passing a mixture of oxygen and nitrogen over an alumina tray in which the mixture of alumina whiskers and contaminating carbon had been placed and heating the tray in a furnace to approximately 1000°C until all the carbon had been oxidised.

Other runs have been carried out at temperatures in the range of 1500°–1700°C and at pressures of 0.1 to 1 atmosphere. Whiskers were obtained when the partial pressure of argon was greater than that of anhydrous aluminium chloride, and the partial pressure should preferably not be greater than 20% of the total pressure within the reaction zone.

Typical specimens of the alumina whiskers, produced by the process, each having a thickness greater than 1 micrometer, were individually submitted to various mechanical tests including strength tests. The following results were obtained:

| | |
|---|---|
| Mean Failure Strain (%) | 1.20 |
| Mean Failure Stress (GN.m$^{-2}$) | 5.52 |
| R.M.S. diameter (micrometers) | 2.86 |
| True Elastic (Young's Modulus,E,(GN.m$^{-2}$) | 460.9 |

What we claim is:

1. A process for the production of alumina whiskers comprising contacting an intimate mixture of particulate alumina-bearing material and a particulate form of carbon with a stream of gaseous aluminium trihalide in a first reaction zone maintained at an elevated temperature at which reaction occurs to form aluminium monohalide and and carbon monoxide, transporting the gaseous products comprising said monohalide and carbon monoxide to a second reaction zone maintained at a lower temperature than said first reaction temperature, this said lower temperature being one at which reversal of the reaction which has occurred in said first reaction zone occurs with formation of a gaseous stream supersaturated with respect to alumina under the conditions prevailing in the second reaction zone and deposition of the desired whisker form of alumina.

2. A process as claimed in claim 1, in which anhydrous aluminium trihalide is formed from its elements in a preliminary reaction zone by passing a mixture of the vapour of the corresponding halogen and an inert carrier gas over high purity molten aluminium.

3. A process as claimed in claim 2, in which the resulting reaction mixture including the aluminium trihalide formed in the preliminary reaction zone is passed over heated unmolten aluminium in a form having a large surface area relative to the volume thereof to ensure that no unreacted halogen is present in the gaseous mixture being passed to the first reaction zone.

4. A process as claimed in claim 1, in which said particulate form of carbon is graphite particles.

5. A process as claimed in claim 1, in which said intimate mixture of particulate alumina-bearing material and particulate carbon comprises substantially 3 parts by weight of alumina and 1 part by weight of carbon.

6. A process as claimed in claim 1, in which the temperature in said first reaction zone is between 1400° and 1800°C.

7. A process as claimed in claim 6, in which the temperature in said first reaction zone is between 1500° and 1700°C.

8. A process as claimed in claim 6, in which the temperature in the second reaction zone is 200° to 400°C lower than the temperature in the first reaction zone but is less than 1400°C.

9. A process as claimed in claim 1, in which a subatmospheric pressure is maintained in the first reaction zone.

10. A process as claimed in claim 1, in which continuous flow occurs from the first reaction zone to the second reaction zone and the pressure in the two zones is substantially the same subatmospheric pressure.

11. A process as claimed in claim 10, in which the pressure is less than 0.5 atmosphere absolute pressure.

12. A process as claimed in claim 1 in which the desired whisker form of alumina is deposited by condensation upon the surface of a substrate of $\alpha$-alumina located in the second reaction zone.

13. A process as claimed in claim 3, which further comprises discontinuing the supply of the gaseous stream containing aluminium trihalide when alumina whiskers have been formed and replacing it by a stream of oxygen-containing gas while continuing to heat said second reaction zone to at least 800°C, the other components of said gas being inert with respect to alumina at raised temperatures to convert deposited carbon contaminating the whiskers of alumina into an oxide of carbon which oxide is then removed from the second reaction zone by passage of said oxygen-containing gas.

14. A process as claimed in claim 8, in which the second cooler reaction zone is a zone of diminishing temperature in the direction of flow of the reaction mixture.

15. A process for the production of alumina whiskers which comprises the steps of contacting an intimate mixture of particles of alumina-bearing material and particles of carbon with a gaseous stream comprising a mixture of aluminium trihalide vapour and an inert carrier gas in a first reaction zone maintained at an elevated temperature of at least 1400°C at which temperature reaction occurs to form a gaseous mixture comprising the corresponding aluminium monohalide and carbon monoxide, transporting said gaseous mixture to a second reaction zone maintained at a less elevated temperature than said first reaction zone but above 1000°C at which latter temperature the reaction which has taken place in said first reaction zone is reversed with formation of alumina and carbon so as to obtain a gaseous mixture containing a low supersaturation of alumina and deposition of alumina takes place from said mixture in the desired whisker form.

* * * * *